United States Patent
Chan et al.

(10) Patent No.: US 6,214,728 B1
(45) Date of Patent: Apr. 10, 2001

(54) METHOD TO ENCAPSULATE COPPER PLUG FOR INTERCONNECT METALLIZATION

(75) Inventors: Lap Chan, San Francisco, CA (US); Sam Fong Yau Li; Hou Tee Ng, both of Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/196,604

(22) Filed: Nov. 20, 1998

(51) Int. Cl.⁷ .................................................. H01L 21/44
(52) U.S. Cl. ...................... 438/678; 438/608; 438/625; 438/642
(58) Field of Search ...................... 438/678, 679, 438/680, 681, 682, 683, 685, 686, 687, 610, 625, 642; 427/230, 231, 96, 97, 98

(56) References Cited

U.S. PATENT DOCUMENTS

| | | | |
|---|---|---|---|
| 5,674,787 | * 10/1997 | Zhao et al. | 437/230 |
| 5,695,810 | * 12/1997 | Dubin et al. | 427/96 |
| 5,824,599 | * 10/1997 | Schacham-Diamand et al. | 438/678 |
| 5,891,513 | * 4/1999 | Dubin et al. | 427/98 |

* cited by examiner

Primary Examiner—Charles Bowers
Assistant Examiner—Laura Schillinger
(74) Attorney, Agent, or Firm—George O. Saile; Rosemary L. S. Pike; Graham S. Jones, II

(57) ABSTRACT

An encapsulated copper plug on a doped silicon semiconductor substrate has a substrate surface, covered with insulation, with a plug hole with a diffusion barrier formed on the walls and the bottom of the hole to the top of the hole. The plug hole is partially filled with an electrolessly deposited copper metal plug. An encapsulating metal deposit caps the plug without any intervening oxidation and degradation. In a transition from copper to a codeposit of copper, an encapsulating Pt, Pd, and/or Ag metal deposits in the electroless bath without oxidation and degradation followed by a pure deposit of the encapsulating metal layer to cap the plug. The surface of the encapsulating metal deposit is formed by overgrowth above the plug hole followed by polishing the surface of the insulator layer removing the overgrowth of the metal layer polished by a CMP process to planarize the surface of the insulator layer which is the top surface of device to achieve coplanarity of metal layer with the topography of the insulator layer.

20 Claims, 1 Drawing Sheet

US 6,214,728 B1

METHOD TO ENCAPSULATE COPPER PLUG FOR INTERCONNECT METALLIZATION

BACKGROUND OF THE INVENTION

1. Field of the Invention

This invention relates to interconnection structures for silicon semiconductor devices and more particularly to methods and apparatus for forming conductive plugs serving as contacts or via connections.

2. Description of Related Art

U.S. Pat. No. 5,674,787 of Zhao et al. for "Selective Electroless Copper Deposited Interconnect Plugs for ULSI Applications" shows selective CU electroless deposition in a via hole using a seed layer. An electroless copper (Cu) deposition method selectively forms encapsulated copper plugs to connect conductive regions of a semiconductor device. A contact displacement technique forms a thin activation copper layer on a barrier metal layer, e.g. TiN, which covers the underlying metal layer. Copper is deposited in the via by an electroless auto-catalytic process. Electroless copper deposition continues until the via is almost filled which leaves sufficient room at the top for an upper encapsulation to be formed there, but first the device is rinsed in DI water to remove the electroless deposition solution. Then after the rising away of the electroless copper solution, a cap barrier layer, from 500 Å to about 1500 Å thick, is formed of a variety of metals or metal alloys such as Ni, Co, Ni—Co alloy, CoP, NiCoP, or NiP from another electroless solution. Sidewalls of SiN or SiON, the bottom barrier layer and the cap barrier layer complete the full encapsulation of the copper plug via.

U.S. Pat. No. 5,470,789 of Misawa for "Process for Fabricating Integrated Circuit Devices" produces a TiN/Cu (titanium nitride/copper) interconnect having a capping layer formed of TiN unlike the Pt, Pd, or Ag cap layer of this invention.

U.S. Pat. No. 4,282,271 of Feldstein for "Dispersions for Activating Non-Conductors for Electroless Plating" shows an electroless deposition technique.

SUMMARY OF THE INVENTION

Alternative metallization metal that is capable of delivering better (1) conductivity and (2) minimizing electromigration is implemented in a design in accordance with this invention. Copper is very much envisaged to be the future metal for interconnect metals in vias and contacts since it meets the above two important criteria. Moreover, deposition of copper by the electroless method seems to be an attractive approach based upon factors such as cost of ownership, simplicity of the process and void-free filling capability. However, copper is very prone to oxidation and degradation unless proper treatment is carried out after deposition. Such oxidation and degradation adversely affect the overall performance of devices.

In accordance with this invention, a method is provided for forming a copper plug on a doped silicon semiconductor substrate having a substrate surface which is covered with an insulation layer which comprises the following steps. Form a plug hole in the insulation layer down to the substrate surface, which plug hole has walls and a bottom comprising a portion of the substrate surface. Form a diffusion barrier on the walls and the bottom of the hole. Partially fill the plug hole with a copper metal deposit to a predetermined depth which is less than the depth of the hole leaving a space in the plug hole above the copper metal deposit. Deposit an encapsulating metal layer on the surface of the copper metal deposit including an overgrowth above the plug hole, and then polish the surface of the insulator layer removing the overgrowth of the metal layer to planarize the surface of the insulator layer which is the top surface of device to achieve coplanarity of metal layer with the topography of the insulator layer.

Preferably, the copper metal deposit is plated in an enclosed environment, such as a plating process which preferably employs an electroless plating bath. After the predetermined depth been reached, the plating continues, gradually switching the constituents in the bath from copper to codeposition of copper and the encapsulating layer followed by plating, preferably electrolessly, only the encapsulating metal layer from the bath into the space at the top of the plug hole above the copper metal deposit and then after filling the plug hole, the plating continues until a small overgrowth has been formed.

Preferably, the encapsulating metal layer is composed of a noble metal, preferably selected from the group consisting of Pt, Pd, and Ag, and the encapsulating layer is then polished by a CMP process after the overgrowth.

Preferably, the diffusion barrier layer is composed of a refractory metal nitride selected from the group consisting of TiN, TaN and WN.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

As semiconductor device dimensions are constantly being scaled down to the deep submicron regime, the current metallization scheme requires revision.

Figure 1:
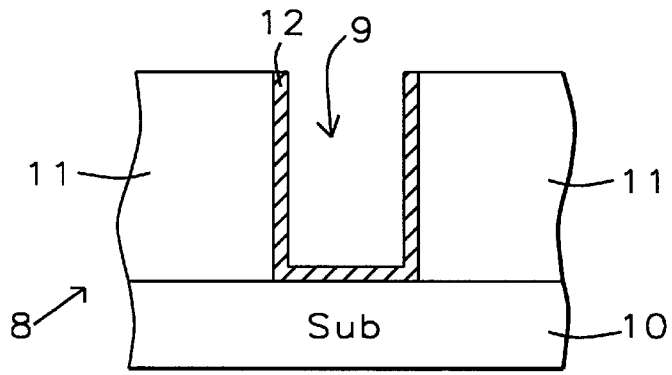
FIG. 1 shows a device in an early stage of manufacture formed on a single crystal silicon semiconductor substrate doped with N-type or P-type dopant which is covered with an insulation layer which has a plug (contact/via) hole formed therein down to the substrate surface with the walls and bottom of the hole coated with a diffusion barrier in accordance with this invention.

FIG. 1 shows a device 8 in an early stage of manufacture. Device 8 is formed on a single crystal silicon semiconductor substrate 10 doped with an impurity selected from a P-type dopant or an N-type dopant in accordance with this invention.

Form Insulator Layer on Semiconductor Substrate

First coat the semiconductor substrate 10 with an insulator layer 11 composed of a material selected from tetraorthosilicate (TEOS) based silicon dioxide (SiO$_2$), or SiH$_4$ based based silicon dioxide (SiO$_2$).

Form Contact/Via Hole in Insulator Layer

A plug (contact/via) hole 9 has been formed through the insulator layer 11 reaching down to the surface of the substrate 10 leaving walls of the insulator layer 11 and the portion of the surface of substrate 10 exposed at the bottom of contact/via hole 9.

Form Diffusion Barrier on Surfaces of Contact/Via Hole

Then form a diffusion barrier layer 12 which coats the exposed surfaces of the plug hole 9 including the walls thereof in the insulator layer 11 as well as the exposed surfaces of the substrate 10 at the bottom of the plug hole 9. The diffusion barrier layer 12 is composed of a refractory metal nitride preferably selected from the group consisting of TiN, TaN and WN, i.e. nitrides of titanium, tantalum and tungsten. The refractory metal nitride diffusion barrier layer 12 is formed by the process of chemical vapor deposition (CVD), physical vapor deposition, or plasma enhanced chemical vapor deposition (PECVD).

Deposit Copper in Contact/Via Hole to Below Top

Figure 2:
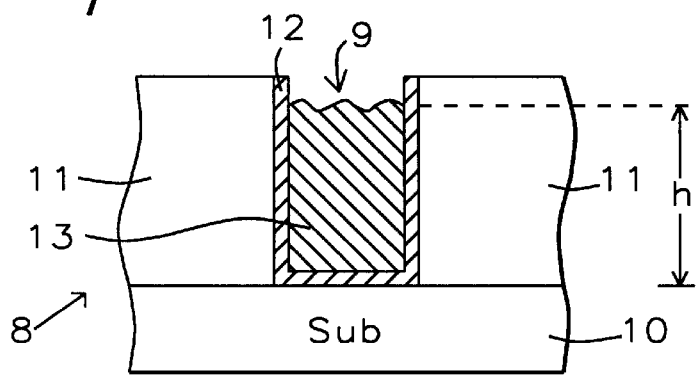
FIG. 2 shows the device of FIG. 1 after the plug (contact/via) hole has been partially filled with a copper metal deposit to the depth "h" which is less than the depth of the contact/via hole.

FIG. 2 shows the device of FIG. 1 after the contact/via hole 9 has been partially filled with a copper metal deposit 13 to the depth "h" which is less than the depth of the contact/via hole 9. A process of electroless deposition of the copper in hole 9 on the exposed surfaces of the diffusion barrier 12 is performed while performing precise monitoring of the growth rate of the copper metal deposit 13.

Deposit Encapsulating Metal Capping Contact/Via Hole

Figure 3:
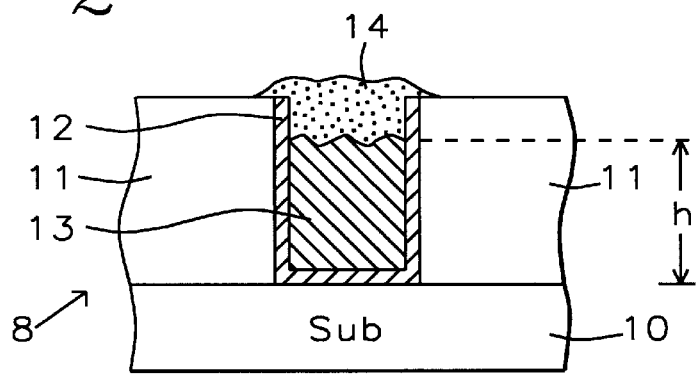
Referring to FIG. 3, the device of FIG. 2 is shown after copper metal deposit has reached the depth "h" in the plug hole. Then, the plating bath is gradually switched to deposit an encapsulating metal layer on the surface of the copper metal deposit.

Referring to FIG. 3, the device of FIG. 2 is shown after copper metal deposit 13 has reached the depth "h" Then, the electroless plating bath is gradually switched to deposit an encapsulating metal layer 14 on the surface of the copper metal deposit 13 by an electroless process. The encapsulating metal layer 14 is composed of a noble metal preferably selected from the group consisting of Ag, Pt, and Pd and mixtures and alloys of metals in the aforesaid group.

Deposit Encapsulating Metal Above Top of Hole

Deposition of the encapsulating metal layer 14 on the surface of the insulator layer 11 continues until a small overgrowth of metal layer 14 occurs extending above the top of contact/via hole 9 as shown in FIG. 3.

Planarize Encapsulating Layer and Insulator Layer

Figure 4:
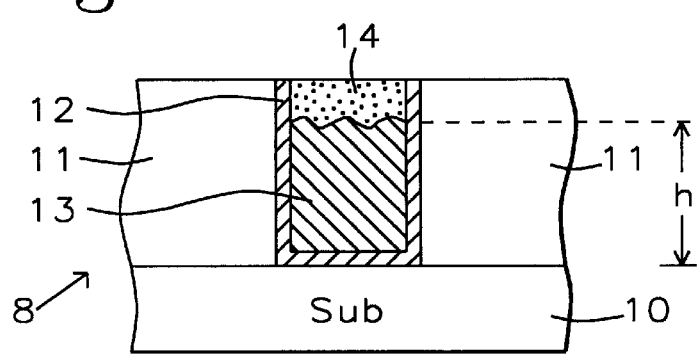
FIG. 4 shows the device of FIG. 3 after polishing the surface of the insulator layer removing the overgrowth of the metal layer shown in FIG. 3, and planarizing the surface of the insulator layer which is the top surface of device to achieve coplanarity of metal layer with the topography of the insulator layer.

FIG. 4 shows the device of FIG. 3 after polishing the surface of the insulator layer 11 removing the overgrowth of metal layer 14, and planarizing the surface of insulator layer 11 which is the top surface of device 8 to achieve coplanarity of metal layer 14 with the topography of insulator layer 11 thereby completing the in situ encapsulation of the copper metal deposit 13. The polishing is performed preferably by a CMP (Chemical Mechanical Polishing) step.

The present invention has several advantages as follows:
1. It allows immediate encapsulation of copper completely after deposition.
2. It enables such encapsulation to be done in situ thus minimizing processing time.
3. It allows selective encapsulation of copper immediately after deposition.
4. It acts as a sacrificial layer during a CMP process (i.e. minimizes dishing effect.)
5. Stopping layer for dry etching (i.e. Via patterning) eliminate Cu halide or Cu oxide formation on the bottom of the Via. Both Cu halide and Cu oxide will cause high via resistance.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a copper plug on a doped silicon semiconductor substrate having a substrate surface which is covered with an insulation layer in the sequence of steps comprising:

forming a plug hole in the insulation layer down to the doped silicon substrate surface, the plug hole having walls, a top and a bottom comprising a portion of the substrate surface, the plug hole having a hole depth, then forming a metal diffusion barrier on the walls and the bottom of in the hole on the doped silicon substrate surface, partially filling the plug hole with a copper metal deposit to a predetermined plug depth as a plug wherein the plug depth is less than the hole depth of the hole leaving a space in the plug hole above the copper metal deposit, depositing an encapsulating metal layer composed of a metal other than copper on the surface of the copper metal deposit including an overgrowth above the plug hole capping the plug and thereby filling the space in the plug hole, and then polishing the surface of the insulator layer removing the overgrowth of the metal layer to planarize the surface of the insulator layer which is the top surface of device to achieve coplanarity of metal layer with the topography of the insulator layer.

2. The method of claim 1 wherein the copper metal deposit is deposited in situ until the predetermined plug depth less than the hole depth has been reached, gradually switching to depositing the encapsulating metal layer in the space in the plug hole above the copper metal deposit without any copper at the top of the plug hole until a small overgrowth of encapsulating the metal layer has been formed above the plug hole.

3. The method of claim 2 wherein the copper metal deposit is plated in an enclosed environment until the predetermined plug depth less than the hole depth has been reached, gradually switching to plating the encapsulating metal layer into the space in the plug hole above the copper metal deposit without any copper at the top of the plug hole until a small overgrowth of the encapsulating metal layer has been formed above the plug hole.

4. The method of claim 1 wherein the copper metal deposit is plated from a plating bath until the predetermined plug depth less than the hole depth has been reached, gradually switching constituents in the bath to plate the encapsulating metal layer from the bath into the space in the plug hole above the copper metal deposit without any copper at the top of the plug hole until a small overgrowth of the encapsulating metal layer has been formed above the plug hole.

5. The method of claim 1 wherein the copper metal deposit is plated from a plating bath in an electroless plating process until the predetermined plug depth less than the hole depth has been reached, gradually switching the constituents in the bath to plate the encapsulating metal layer from the bath electrolessly into the space in the plug hole above the copper metal deposit without any copper at the top of the plug hole until a small overgrowth of the metal layer has been formed above the plug hole.

6. The method of claim 1 wherein the diffusion barrier layer comprises a refractory metal nitride.

7. The method of claim 1 wherein the diffusion barrier layer is composed of a refractory metal nitride selected from the group consisting of TiN, TaN and WN.

8. The method of claim 2 wherein:
the copper metal deposit is plated in an enclosed environment until the predetermined plug depth less than the hole depth has been reached, gradually switching to plating the encapsulating metal layer into the space in the plug hole above the copper metal deposit without any copper at the top of the plug hole until a small overgrowth of the metal layer has been formed above the plug hole, and
the diffusion barrier layer is composed of a refractory metal nitride selected from the group consisting of TiN, TaN and WN.

9. The method of claim 1 wherein:
the copper metal deposit is plated from a plating bath until the predetermined plug depth less than the hole depth has been reached, gradually switching the constituents in the bath to plate the encapsulating metal layer from the bath into the space in the plug hole above the copper metal deposit without any copper at the top of the plug hole until a small overgrowth of the metal layer has been formed above the plug hole,
the diffusion barrier layer is composed of a refractory metal nitride, and
the encapsulating metal comprises a noble metal which is polished and planarized with the insulator layer by a CMP process.

10. The method of claim 1 wherein:
the copper metal deposit is plated from a plating bath in an electroless plating process until the predetermined plug depth less than the hole depth has been reached, gradually switching the constituents in the bath to plate the encapsulating metal layer from the bath electrolessly into the space in the plug hole above the copper metal deposit without any copper at the top of the plug hole until a small overgrowth of the metal layer has been formed above the plug hole,
the diffusion barrier layer is composed of a refractory metal nitride selected from the group consisting of TiN, TaN and WN, and
the encapsulating metal layer is composed of a material selected from the group consisting of Pt, Pd, and Ag which is polished and planarized with the insulator layer by a CMP process.

11. A method of forming a copper plug on a doped silicon semiconductor substrate having a substrate surface which is covered with an insulation layer in the sequence of steps comprising:
forming a plug hole in the insulation layer down to the doped silicon substrate surface, the plug hole having walls, a top and a bottom comprising a portion of the substrate surface, the plug hole having a hole depth,
forming a refractory metal diffusion barrier on the walls and the bottom of the hole on the doped silicon substrate surface,
partially filling the plug hole with a copper metal deposit to a predetermined plug depth as a plug wherein the plug depth is less than the hole depth of the hole leaving a space in the plug hole above the copper metal deposit with the refractory metal diffusion barrier exposed above the copper metal deposit,
depositing an encapsulating metal layer composed of a metal other than copper in the plug hole on the surface of the copper metal deposit and including an overgrowth above the plug hole capping the plug and thereby filling the space, and
then polishing the surface of the insulator layer removing the overgrowth of the metal layer to planarize the surface of the insulator layer which is the top surface of device to achieve coplanarity of metal layer with the topography of the insulator layer.

12. The method of claim 11 wherein the copper metal deposit is deposited in situ until the predetermined plug depth less than the hole depth has been reached, gradually switching to depositing the encapsulating metal layer in the space in the plug hole above the copper metal deposit without any copper at the top of the plug hole until a small overgrowth of encapsulating the metal layer has been formed above the plug hole.

13. The method of claim 12 wherein the copper metal deposit is plated in an enclosed environment until the predetermined plug depth less than the hole depth has been reached, gradually switching to plating the encapsulating metal layer into the space in the plug hole above the copper metal deposit without any copper at the top of the plug hole until a small overgrowth of the encapsulating metal layer has been formed above the plug hole.

14. The method of claim 11 wherein the copper metal deposit is plated from a plating bath until the predetermined plug depth less than the hole depth has been reached, gradually switching constituents in the bath to plate the encapsulating metal layer from the bath into the space in the plug hole above the copper metal deposit without any copper at the top of the plug hole until a small overgrowth of the encapsulating metal layer has been formed above the plug hole.

15. The method of claim 11 wherein the copper metal deposit is plated from a plating bath in an electroless plating process until the predetermined plug depth less than the hole depth has been reached, gradually switching the constituents in the bath to plate the encapsulating metal layer from the bath electrolessly into the space in the plug hole above the copper metal deposit without any copper at the top of the plug hole until a small overgrowth of the metal layer has been formed above the plug hole.

16. The method of claim 11 wherein the diffusion barrier layer comprises a refractory metal nitride.

17. The method of claim 11 wherein the diffusion barrier layer is composed of a refractory metal nitride selected from the group consisting of TiN, TaN and WN.

18. The method of claim 12 wherein:
the copper metal deposit is plated in an enclosed environment until the predetermined plug depth less than the hole depth has been reached, gradually switching to plating the encapsulating metal layer into the space in the plug hole above the copper metal deposit without any copper at the top of the plug hole until a small overgrowth of the metal layer has been formed above the plug hole, and the diffusion barrier layer is composed of a refractory metal nitride selected from the group consisting of TiN, TaN and WN.

19. The method of claim 11 wherein:

the copper metal deposit is plated from a plating bath until the predetermined plug depth less than the hole depth has been reached, gradually switching the constituents in the bath to plate the encapsulating metal layer from the bath into the space in the plug hole above the copper metal deposit without any copper at the top of the plug hole until a small overgrowth of the metal layer has been formed above the plug hole, the diffusion barrier layer is composed of a refractory metal nitride, and the encapsulating metal comprises a noble metal which is polished and planarized with the insulator layer by a CMP process.

20. The method of claim 11 wherein:

the copper metal deposit is plated from a plating bath in an electroless plating process until the predetermined plug depth less than the hole depth has been reached, gradually switching the constituents in the bath to plate the encapsulating metal layer from the bath electrolessly into the space in the plug hole above the copper metal deposit without any copper at the top of the plug hole until a small overgrowth of the metal layer has been formed above the plug hole, the diffusion barrier layer is composed of a refractory metal nitride selected from the group consisting of TiN, TaN and WN, and the encapsulating metal layer is composed of a material selected from the group consisting of Pt, Pd, and Ag which is polished and planarized with the insulator layer by a CMP process.

* * * * *

UNITED STATES PATENT AND TRADEMARK OFFICE
CERTIFICATE OF CORRECTION

PATENT NO. : 6,214,728 B1
DATED : April 10, 2001
INVENTOR(S) : Lap Chan, Sam Fong Yau Li, Hou Tee Ng It is certified that error appears in the above-identified patent and that said Letters Patent is hereby corrected as shown below:

<u>Title page,</u>
Item [73], add -- National Univerty of Singapore, Singapor, Singapore -- to list of Assignees Signed and Sealed this Sixteenth Day of October, 2001

Attest:

NICHOLAS P. GODICI
Attesting Officer    Acting Director of the United States Patent and Trademark Office